United States Patent
Chao et al.

(10) Patent No.: US 7,186,614 B2
(45) Date of Patent: Mar. 6, 2007

(54) METHOD FOR MANUFACTURING HIGH DENSITY FLASH MEMORY AND HIGH PERFORMANCE LOGIC ON A SINGLE DIE

(75) Inventors: Henry S. Chao, Cupertino, CA (US); Ervin T. Hill, Los Lunas, NM (US)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 10/705,192

(22) Filed: Nov. 10, 2003

(65) Prior Publication Data

US 2005/0098821 A1    May 12, 2005

(51) Int. Cl.
    *H01L 21/336*     (2006.01)
(52) U.S. Cl. .................................... 438/257
(58) Field of Classification Search ............... 438/706, 438/689, 586, 424, 253, 240, 59, 3, 597, 438/257
See application file for complete search history.

(56) References Cited

U.S. PATENT DOCUMENTS 6,235,587 B1    5/2001   Hsaio et al.
6,417,086 B1*   7/2002   Osari ..................... 438/594
2004/0043592 A1*   3/2004   Goodwin et al. ........ 438/586

FOREIGN PATENT DOCUMENTS

EP     1 156 524 A1    11/2001

OTHER PUBLICATIONS

PCT Search Report, International Application No. PCT/US2004/036096, filing date Oct. 29, 2004, mailed Apr. 21, 2005 (9 pages).

* cited by examiner

*Primary Examiner*—Carl Whitehead, Jr.
*Assistant Examiner*—Monica D. Harrison
(74) *Attorney, Agent, or Firm*—Cyndi Wheeler (57) ABSTRACT

A method of forming high performance logic transistors and high density flash transistors on a single substrate is disclosed. In one embodiment, the method comprises: forming a logic gate stack in a logic region on a substrate, forming a flash memory gate stack in a flash region on the substrate, depositing a hardmask layer over the logic gate stack and over the flash memory gate stack, patterning the hardmask in the logic region so that areas of hardmask remain where logic gates are desired, patterning the flash gate stack in the flash region to form flash memory gates, and etching the logic gate stack using the remaining hardmask as a mask to form logic gates.

28 Claims, 6 Drawing Sheets

METHOD FOR MANUFACTURING HIGH DENSITY FLASH MEMORY AND HIGH PERFORMANCE LOGIC ON A SINGLE DIE

BACKGROUND OF THE INVENTION

1. Field of the Invention

The present invention relates to the field of semiconductor device fabrication, and in particular, to fabricating both high density flash memory transistors and high performance logic transistors on the same semiconductor die.

2. Discussion of Related Art

Present semiconductor fabrication process technology may be used to generate discrete high density flash memory and high performance logic on separate wafers, and hence, separate chips. These two types of devices are not easily manufactured on the same wafer or on the same die.

Figure 1:
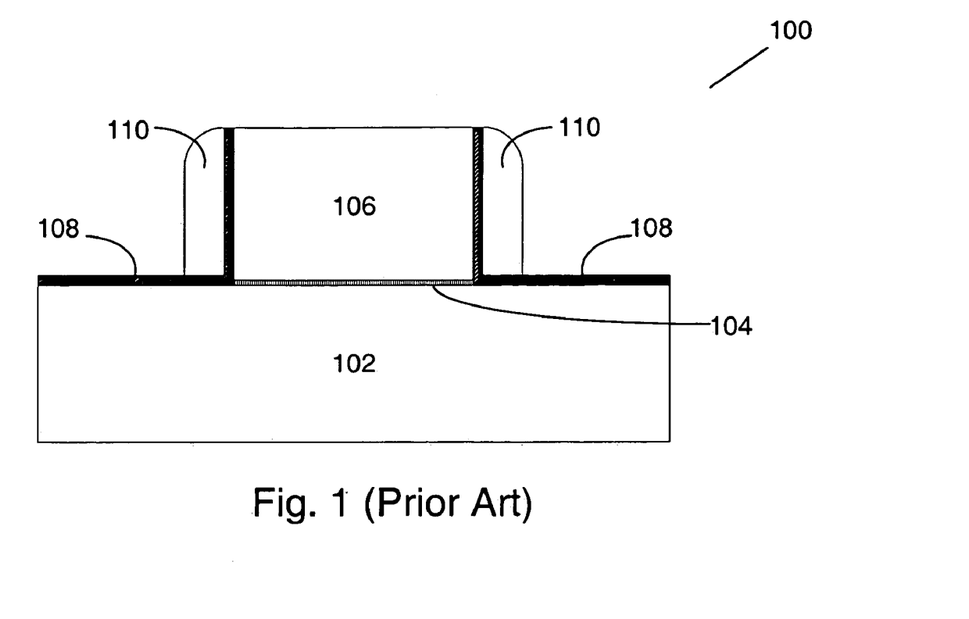
FIG. 1 is an illustration of a cross-sectional view of a logic transistor.

FIG. 1 illustrates a logic transistor 100. Logic transistor 100 is formed on substrate 102. The gate stack of logic transistor 100 consists of a gate electrode layer 106 deposited over the gate dielectric 104 on substrate 102. Source/drain spacer liner dielectric 108 is formed on either side of the gate stack. Source/drain spacer dielectric 110 is formed on either side of the gate stack on top of the source/drain spacer liner dielectric 108.

Figure 2:
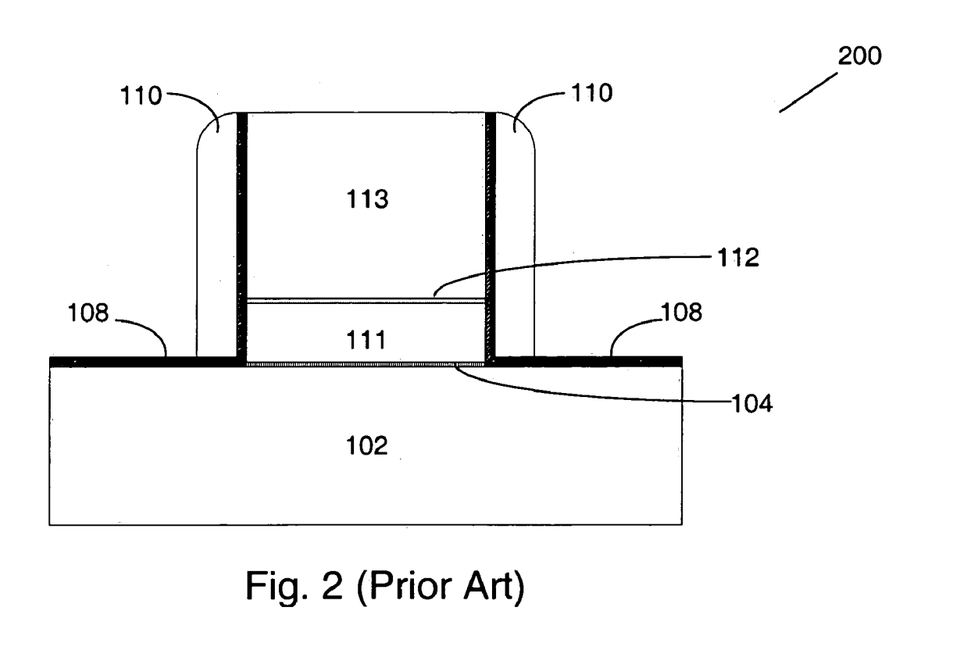
FIG. 2 is an illustration of a cross-sectional view of a flash memory transistor.

FIG. 2 illustrates a flash memory transistor 200. Flash memory transistor 200 is formed on substrate 102. The gate stack of flash memory transistor 200 consists of a control gate electrode layer 113 deposited over an inter-electrode dielectric 112, over a floating gate layer 111, over the gate dielectric 104, on a substrate 102. Source/drain spacer liner dielectric 108 is formed on either side of the flash memory gate stack. Source/drain spacer dielectric 110 is formed on either side of the gate stack on top of the source/drain spacer liner dielectric 108.

Because the flash memory gate stack is significantly different from the logic gate stack, separate gate patterning masking steps are required to enable the different etches required to etch each gate stack. However, patterning of one set of gates will create large topographic steps at the boundaries between the flash and logic regions, because the height of the flash gate stack is greater than the height of the logic gate stack. The topographic steps may lead to large lithographic proximity effects where there is poor control over the critical dimensions near the flash/logic boundaries.

Presently, both flash memory and logic transistors may be formed on the same die, however present semiconductor fabrication methods do not permit fabrication of both flash memory transistors having minimum critical dimensions and logic transistors having minimum critical dimensions on the same die. Large topographic steps formed between the flash gate stack and the logic gate stack lead to poor control over gate critical dimensions, thus only one of either flash or logic gates having minimum critical dimensions may be formed on a die.

DETAILED DESCRIPTION OF THE PRESENT INVENTION

In the following description, numerous specific details are set forth, such as exact process steps, in order to provide a thorough understanding of the present invention. It will be apparent, however, to one skilled in the art that these specific details need not be employed to practice the present invention. In other instances, well known components or methods have not been described in detail in order to avoid unnecessarily obscuring the present invention.

Figure 3:
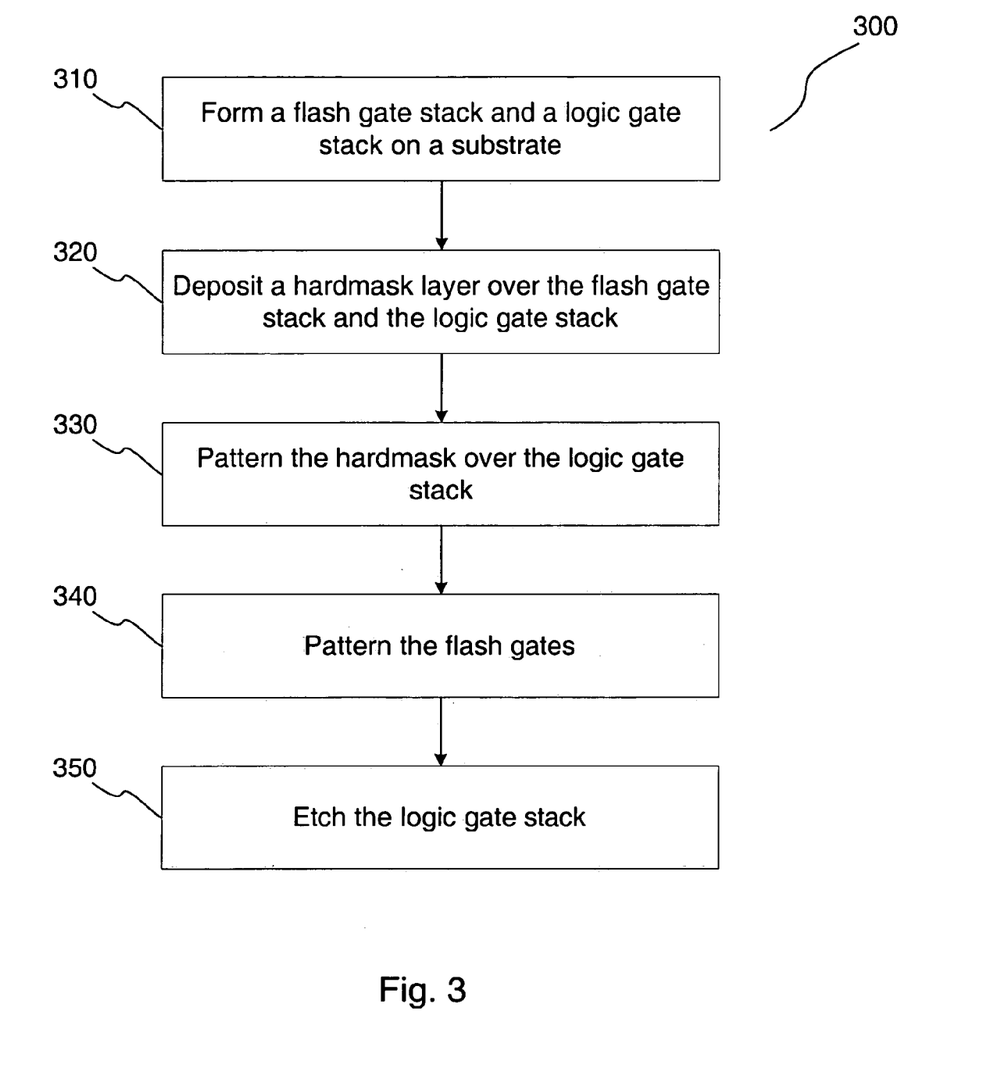
FIG. 3 is a flow diagram illustrating a process in accordance with one embodiment of the present invention.

FIG. 3 is a flow diagram 300, showing a process in accordance with one embodiment of the present invention. Flow diagram 300 illustrates a general method of forming high density flash memory transistors and high performance logic transistors on the same substrate. In one embodiment of the present invention, high density flash memory transistors may have gate lengths of less than 150 nm, and may be located less than 400 nm from each other. High performance logic transistors may have gate lengths of less than approximately 200 nm. In one embodiment of the present invention, the high density flash memory and the high performance logic transistors are formed on the same semiconductor wafer. In another embodiment of the present invention, the high density flash memory and the high performance logic transistors are formed on the same die. According to an embodiment of this invention, the smallest line widths and pitches at a technology node for both flash and logic transistors can be generated on the same semiconductor substrate.

First, a flash memory gate stack and a logic gate stack are formed on a substrate, as set forth in block 310. Conventional semiconductor processing techniques may be used to form each gate stack, as described below. After the gate stacks have been deposited, a hardmask layer is deposited over both the flash gate stack and the logic gate stack, as set forth in block 320. The hardmask layer is then patterned in the logic region, as set forth in block 330. Next, the flash memory gates are patterned, as set forth in block 340. Finally, the logic gate stack is etched, using the remaining hardmask layer as a mask, as set forth in block 350.

Each block of the flow diagram is illustrated in FIGS. 4–10, and will be described in more detail below.

Figure 4:
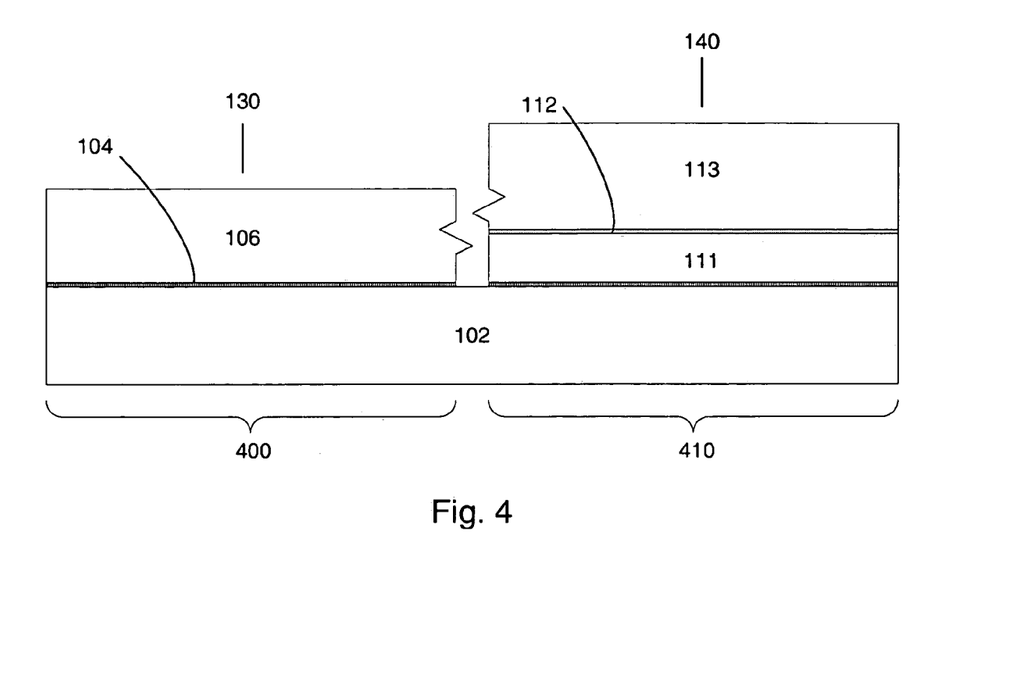
FIG. 4 is an illustration of a cross-sectional view of a logic gate stack and a flash memory gate stack on the same substrate.

FIG. 4 illustrates a logic gate stack 130 and a flash memory transistor gate stack 140 formed adjacent to each other or in close proximity to one another on a single substrate 102 according to one embodiment of the present invention. The logic gate stack 130 may be comprised of a gate electrode layer 106 deposited over the gate dielectric 104 on semiconductor substrate 102, and is formed in logic region 400. In one embodiment of the present invention, the gate dielectric 104 may comprise a silicon oxide or a silicon oxynitride. The gate electrode layer 106 may comprise polysilicon. The flash memory gate stack 140 may be comprised of a control gate electrode layer 113 formed over an inter-electrode dielectric 112, over a floating gate layer 111, over the gate dielectric 104, on semiconductor substrate 102, and is formed in flash region 410. In one embodiment of the present invention, the gate dielectric 104 may comprise a silicon oxide or silicon oxynitride. The inter-electrode dielectric 112 may comprise an ONO (oxide-nitride-oxide) layer. The floating gate layer 111 may comprise an n-type polysilicon layer. The control gate electrode 113 may comprise polysilicon. The control gate electrode 113 of the flash gate stack is the same layer as the gate electrode layer 106 of the logic gate stack, thus control gate electrode 113 and gate electrode 106 comprise the same material. In one embodiment of the present invention, the logic gate stack is approximately 2000 Å thick. In one embodiment of the present invention, the flash gate stack is approximately 2500 Å thick. The thickness of each gate stack may vary considerably depending on the number and thickness of the layers comprising the gate stack.

In one embodiment of the present invention, the flash and logic gate stacks are formed in close proximity to one another on a single semiconductor substrate in the following manner. First the isolation is formed. The gate oxide is then grown or deposited in both the flash and the logic regions. After forming the gate oxide, the flash floating gate layer is deposited on both the flash and the logic regions. The flash floating gate is then partially defined in the flash region and is removed from the logic region. The flash floating gate may be self aligned to the flash array isolation, or may be defined by a patterning step. After defining the flash floating gate, an interlayer dielectric is deposited in both the flash and the logic regions. The interlayer dielectric and any other dielectric, including the gate oxide previously formed, are removed from the logic region. Next, the logic gate dielectric is grown, and the control gate is deposited in both the flash and the logic regions. In other embodiments of the present invention, a different method may be used to form the flash and logic gate stacks in close proximity to one another on the same die.

The flash memory gate stack 140 is thicker than the logic gate stack 130, because the flash memory gate stack may include at least two additional layers not found in a logic gate: the inter-electrode dielectric and the floating gate. The height difference between the flash memory gate stack and the logic gate stack is typically between 500 Å to 1000 Å, but may be greater or less than this range depending on the composition of each of the respective gate stacks.

Figure 5:
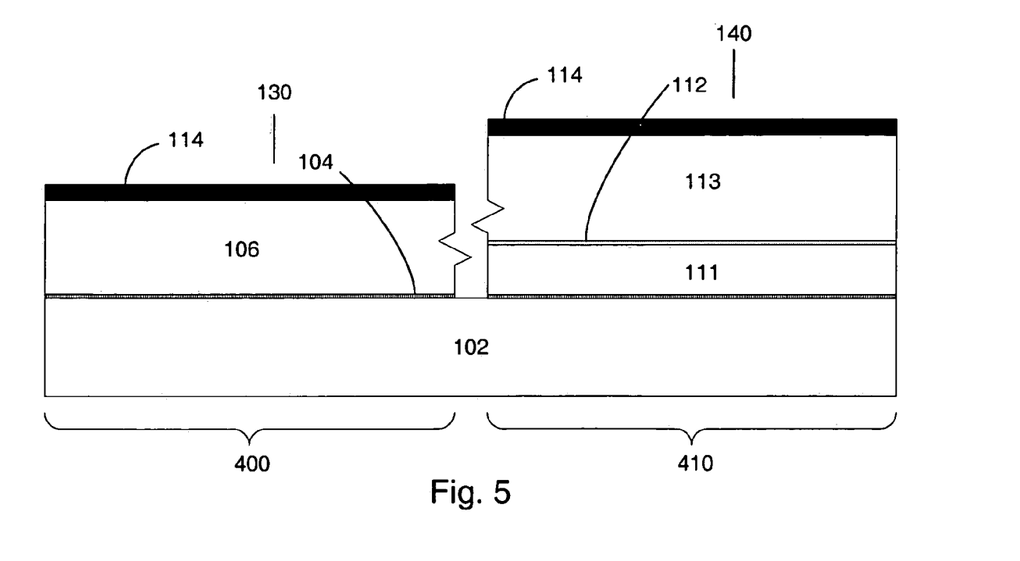
FIG. 5 is an illustration of a cross-sectional view of a logic gate stack and a flash memory gate stack on the same substrate after a hardmask layer is formed.

FIG. 5 illustrates a hardmask layer 114 formed over both the logic gate stack 130 and the flash gate stack 140. In one embodiment of the present invention, the hardmask layer 114 is an anti-reflective coating (ARC) hardmask material. The ARC hardmask layer serves to eliminate undesirable optical effects from subsequent lithography operations. Ideally, the hardmask will comprise a material that can be selectively etched with respect to the gate stack layers. The ARC hardmask layer may be comprised of an oxide/oxynitride film stack. In other embodiments, the ARC hardmask layer may be comprised of nitride, carbon, or combinations of different anti-reflective coatings. The thickness of the hardmask layer and the properties of the layer are determined for optimal lithography performance in subsequent process operations. Ideally, the hardmask layer must be targeted to meet optimal lithography variability while being thick enough to withstand multiple etches and thin enough so that it may be reasonably easily removed. In one embodiment of the present invention, for a 248 nm lithography wavelength, the hardmask layer is between 200 and 400 Å thick. In one embodiment of the present invention, the material used for the hardmask layer will withstand subsequent process operations without significant degradation.

Figure 6:
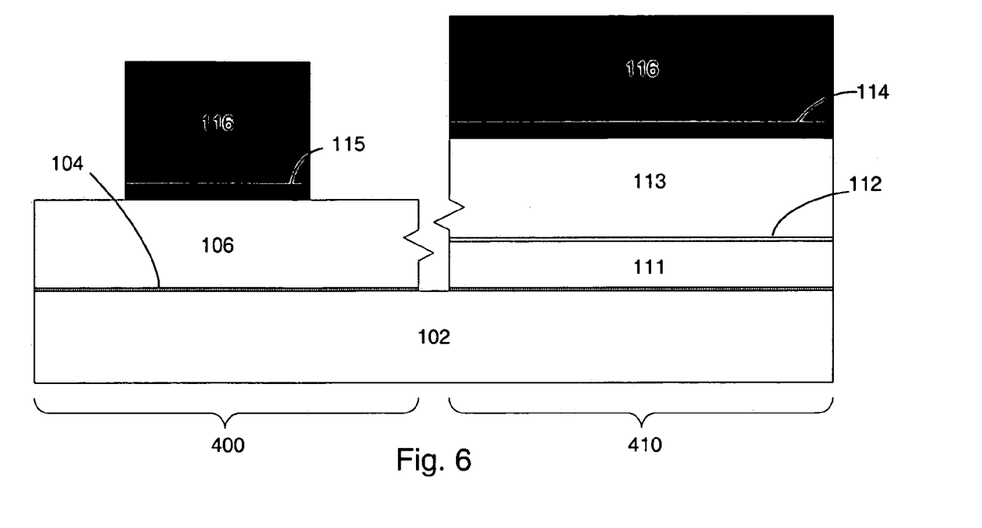
FIG. 6 is an illustration of a cross-sectional view of a logic gate stack and a flash memory gate stack on the same substrate after the hardmask is patterned in the logic region.

After hardmask layer 114 is formed, the hardmask layer 114 in the logic region 400 of the die is patterned using standard lithographic techniques, and etching to form hardmask 115 as shown in FIG. 6. First, a layer of resist 116 is formed on the top surface of the die. In the logic region, the hardmask is patterned to define the regions where logic gates are desired. In one embodiment of the present invention, the hardmask is removed by an etch process. The remaining regions of hardmask 115 define the areas where logic transistor gates will be formed. The flash region 410 remains covered with resist while the hardmask is patterned in the logic region. After patterning the hardmask 115 in logic region 400, resist 116 is removed from the surface of the die.

Figure 7:
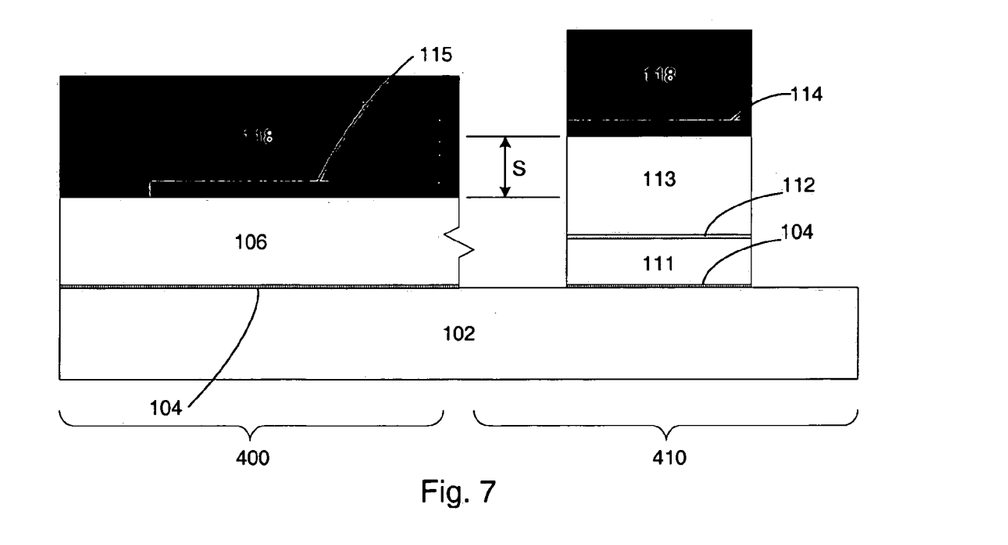
FIG. 7 is an illustration of a cross-sectional view of a logic gate stack and a flash memory gate stack on the same substrate after the flash memory gate stack is patterned to form flash memory gates.

Next, the flash memory gates in the flash region of the die 410 are patterned using standard lithographic techniques, as illustrated in FIG. 7. A layer of resist 118 is formed on the top surface of the die in both the flash and logic regions. The flash gates are then patterned in the flash region 410. The topographic step, S, between the logic and flash regions of the die is minimized because the logic gate electrode has not yet been completely etched. In one embodiment of the present invention, the topographic step, S is approximately 500 Å. Thus, lithographic resist thickness variations are minimized at the logic/flash interface, which in turn reduces variations in critical dimensions near the logic/flash interface. The hardmask layer also contributes to further reduction of critical dimension variation due to any residual resist variations.

In one embodiment of the present invention, the entire flash gate stack is patterned, including the hardmask 114, gate electrodes 106, inter-electrode dielectric 112, and gate dielectric 104, as illustrated in FIG. 7.

The logic region 400 of the die remains covered with resist while all or part of the flash gate stack is patterned. After patterning the flash gate stack as described above, resist 118 is removed from the surface of the die.

Figure 8:
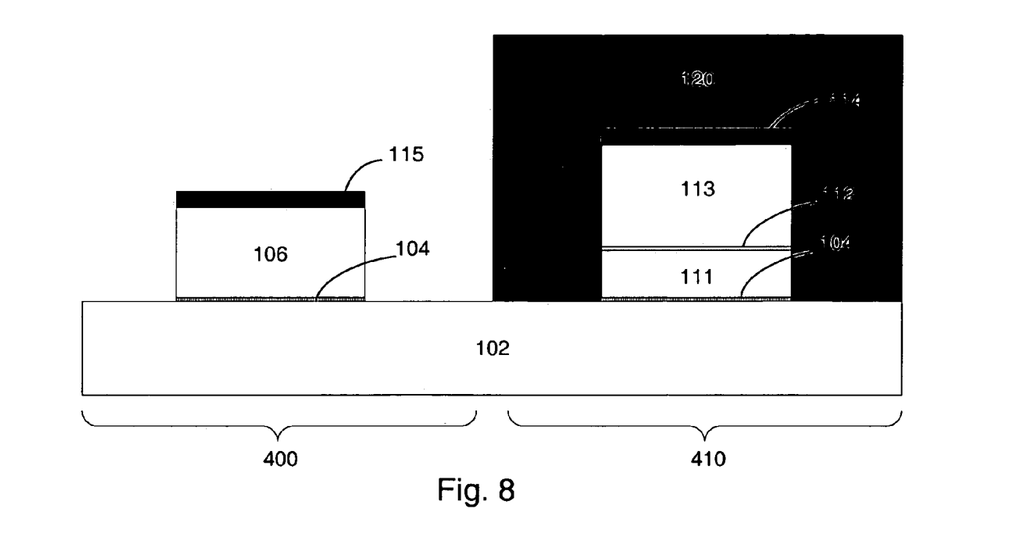
FIG. 8 is an illustration of a cross-sectional view of a logic gate stack and a flash memory gate stack on the same substrate after the logic gate stack has been etched.

Finally, as illustrated in FIG. 8, the remaining hardmask 115 in the logic region is used as a mask to etch the logic gate electrode 106, forming logic gates. In one embodiment of the present invention, a layer of resist is patterned to cover the flash memory gate stack with resist 120, leaving only the logic region 400 exposed. The logic gate stack is then etched using the remaining hardmask as a pattern, and regions of the logic gate stack that are not protected by hardmask 115 are removed. The resist 120 protects the flash memory gate stack while the logic gate stack is etched, preventing degradation of the gate stack and substrate in the flash region. This is a non-critical masking operation. After the logic gate stack is etched, resist 120 is removed from the surface of the die.

In another embodiment of the present invention, the both the flash region 410 and the logic region 400 may be exposed while the logic gate stack is etched, and no resist is used to protect the flash region 410. In this embodiment, a highly selective etch process must be used such that only the logic gate electrode material will be etched, to ensure that no substrate pitting occurs in the flash region 410. Because the hardmask layer in both the flash and the logic regions is exposed during etching, the hardmask layer may be sufficiently damaged by the final logic gate stack etch so that it may subsequently be more easily removed from the surface of the die.

Figure 9:
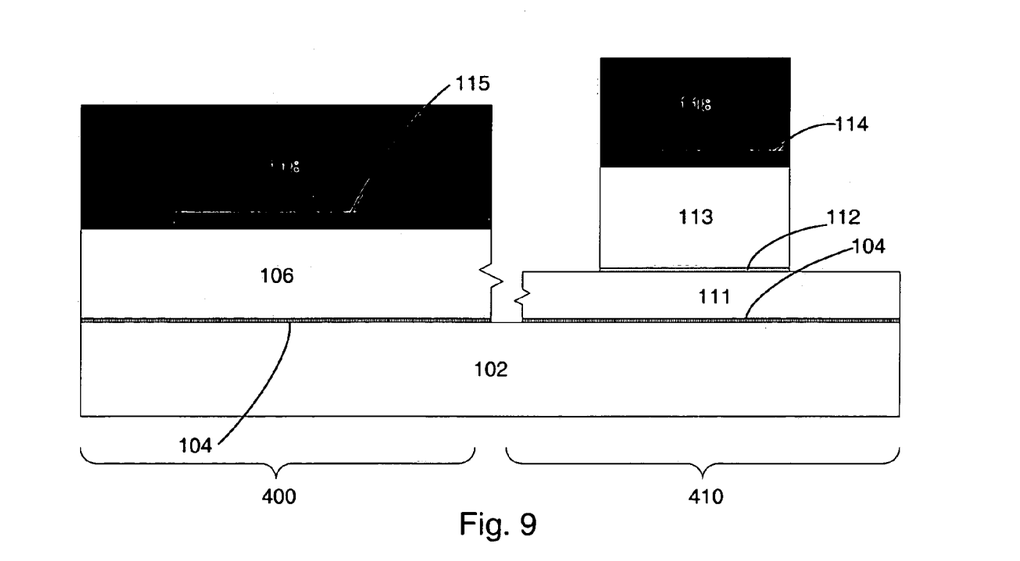
FIG. 9 is an illustration of a cross-sectional view of a logic gate stack and a flash memory gate stack on the same substrate after the flash memory gate stack has been partially etched.

FIG. 9 illustrates another embodiment of the present invention. In this embodiment only the hardmask 114, control gate 106, and inter-electrode dielectric 112 of the flash gate stack are etched during the flash gate patterning operation as described above. The floating gate electrode layer 111 and the gate dielectric layer 104 are left intact. The remaining floating gate electrode and gate dielectric layer may be removed in a subsequent process operation to complete the formation of the flash gate. In one embodiment of the present invention, the remaining flash floating gate electrode is etched at the same time the logic gate electrode is etched.

In another embodiment of the present invention, both the flash region 410 and the logic region 400 are exposed, and both the logic gate stack and the remaining flash floating gate electrode are etched, using the hardmask in the logic region and the hardmask in the flash region as a mask for the etch.

Figure 10:
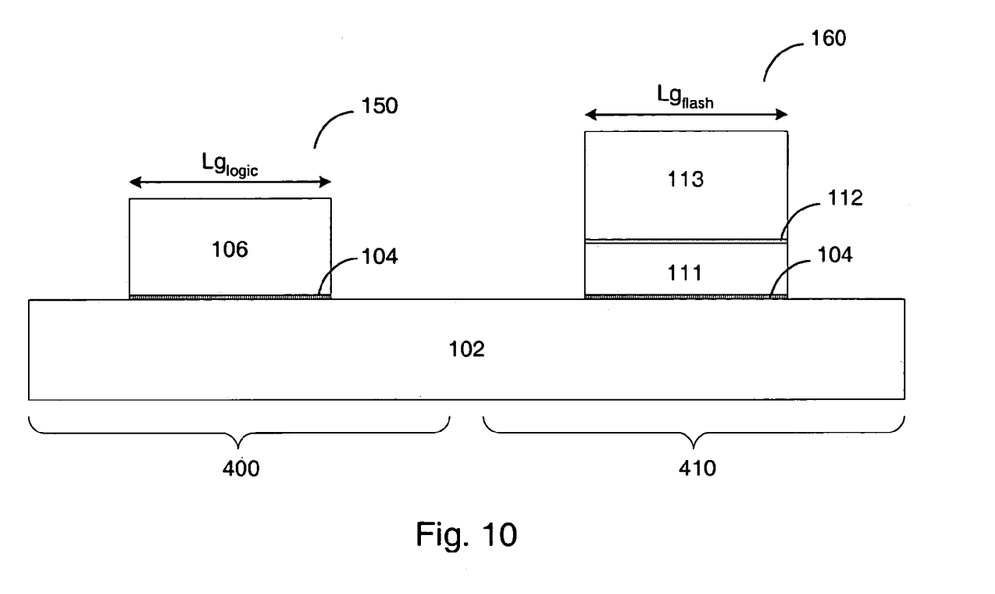
FIG. 10 is an illustration of a cross-sectional view of a logic gate stack and a flash memory gate stack on the same substrate after both gate stacks have been etched.

After both the logic gate(s) 150 and the flash gate(s) 160 have been formed, the hardmask may be removed from to top surface of the logic gate(s) and the flash gate(s), as illustrated in FIG. 10. Removal of the hardmask allows for complete silicidation of the gate electrode in subsequent processing operations.

In one embodiment of the present invention, the gate length of the high performance logic transistor gate, $Lg_{logic}$, is less than approximately 150 nm. The gate length of the high density flash transistor gate, $Lg_{flash}$, is less than approximately 200 nm. The high density flash transistor pitch is less than 400 nm.

Conventional processing techniques may be used to complete transistor formation for both the flash memory transistors and the logic transistors, including, but not limited to silicidation of the gate electrode, formation of source/drain regions, formation of source/drain spacer liner dielectrics, and formation of source/drain spacer dielectrics.

The present invention may be implemented with various changes and substitutions to the illustrated embodiments. For example, the present invention may be implemented on various types of thin film stacks having different heights. The present invention is not limited only to flash memory and logic transistor gate stacks. Furthermore, the present invention may be implemented on flash memory gates and logic gates whose gate stacks vary from those described herein. For example, a flash memory gate stack or a logic gate stack may contain additional or different layers than those described herein.

Although specific embodiments, including specific parameters, methods, and materials have been described, it will be readily understood by those skilled in the art and having the benefit of this disclosure, that various other changes in the details, materials, and arrangements of the materials and steps which have been described and illustrated in order to explain the nature of this invention may be made without departing from the principles and scope of this invention as expressed in the subjoined claims.

We claim:

1. A method comprising:
    forming a logic gate stack in a logic region on a substrate;
    forming a flash memory gate stack in a flash region on the substrate;
    depositing a hardmask layer over the logic gate stack and over the flash memory gate stack;
    patterning the hardmask in the logic region so that areas of hardmask remain where logic gates are desired;
    patterning the flash gate stack in the flash region to form flash memory gates; and
    subsequently etching the logic gate stack using the remaining hardmask as a mask to form logic gates.

2. The method of claim 1, wherein the logic region and the flash region are located on a single die.

3. The method of claim 2, wherein the logic gate stack is comprised of a gate dielectric layer and a gate electrode layer.

4. The method of claim 2, wherein the flash memory gate stack is comprised of a gate dielectric layer, a floating gate layer, an inter-electrode dielectric layer, and a control gate electrode layer.

5. The method of claim 1, further comprising removing the hardmask layer.

6. The method of claim 1, wherein the hardmask layer consists of an anti-reflective coating (ARC) hardmask layer.

7. The method of claim 6, wherein the ARC hardmask layer is comprised of one or more materials selected from the group consisting of oxide, oxynitride, nitride, and carbon.

8. The method of claim 6, wherein the ARC hardmask layer is sufficiently damaged by the final logic gate stack etch that it may be easily removed.

9. The method of claim 1, further comprising depositing a masking layer over the flash region after patterning the flash gate stack and before etching the logic gate stack to form logic gates.

10. The method of claim 1, wherein the flash memory gates have a length of less than 150 nm and have a pitch of less than 400 nm, and the logic gates have a length of less than 150 nm.

11. A method comprising:
    forming a logic gate stack in a logic region on a substrate;
    forming a flash memory gate stack in a flash region on the substrate;
    depositing an anti-reflective coating (ARC) hardmask layer over the logic gate stack and over the flash memory gate stack;
    depositing a first layer of resist over the logic region and the flash region;
    patterning the first layer of resist in the logic region and etching the first layer of resist and the ARC hardmask layer in the logic region, leaving areas of the first layer of resist and hardmask over the areas where logic gates are desired;
    removing the first layer of resist from the logic region and the flash region;
    depositing a second layer of resist over the logic region and the flash region;
    patterning the second layer of resist in the flash region and etching the second layer of resist, the ARC hardmask layer, and the flash memory gate stack in the flash region to form flash memory gates;
    removing the second layer of resist from the logic region and the flash region;
    depositing a third layer of resist over the flash region; and
    etching the logic gate stack to form logic gates using the remaining ARC hardmask as a mask.

12. The method of claim 11, further comprising removing the third layer of resist from the flash region.

13. The method of claim 11, wherein the logic region and the flash region are located on a single die.

14. The method of claim 11, wherein the logic gate stack is comprised of a gate dielectric layer and a gate electrode layer.

15. The method of claim 11, wherein the flash memory gate stack is comprised of a gate dielectric layer, a floating gate layer, an inter-electrode dielectric layer, and a control gate electrode layer.

16. The method of claim 11, wherein the ARC hardmask layer is comprised of one or more materials selected from the group consisting of oxide, oxynitride, nitride, and carbon.

17. The method of claim 11, wherein the flash memory gates have a length of less than 150 nm and a pitch of less than 400 nm, and the logic gates have a length of less than 150 nm.

18. An apparatus comprising:
a substrate, the substrate having a logic region and a flash region;
a logic gate stack formed on the substrate in the logic region, the logic gate stack having a top surface;
regions of anti-reflective coating (ARC) formed on the top surface of the logic gate stack, the regions of ARC covering the areas of the logic gate stack where logic gates are to be formed;
a plurality of flash memory gates formed on the substrate, the flash memory gates having a top surface; and
a layer of resist, wherein the resist covers at least the top surface of the logic gate stack, the regions of ARC formed on top of the logic gate stack, and the top surface of the flash memory gates.

19. The apparatus of claim 18, wherein the logic gate stack is comprised of a gate dielectric layer and a gate electrode layer.

20. The apparatus of claim 18, wherein the flash memory gates are comprised of a gate dielectric layer, a floating gate layer, an inter-electrode dielectric layer, and a control gate electrode layer.

21. The apparatus of claim 18, wherein the ARC is comprised of one or more materials selected from the group consisting of oxide, oxynitride, nitride, and carbon.

22. The apparatus of claim 18, wherein the flash memory gates have a gate length of less than 150 nm and a pitch of less than 400 nm.

23. A method comprising:
forming a first stack in a first region on a substrate and a second stack in a second region on the substrate, wherein the second stack is thicker than the first stack;
depositing a hardmask layer over the first stack and the second stack;
patterning the first region to remove portions of hardmask in the first region;
patterning the second region to remove portions of the hardmask in the second region and portions of the second stack to form the desired geometries of the second stack; and
subsequently removing portions of the first stack using the remaining portions of hardmask as a mask to form the desired geometries of the first stack.

24. A method comprising:
forming a logic gate stack in a logic region on a substrate;
forming a flash memory gate stack in a flash region on the substrate;
depositing a hardmask layer over the logic gate stack and over the flash memory gate stack;
patterning the hardmask in the logic region so that areas of hardmask remain where logic gates are desired;
patterning the flash gate stack in the flash region and etching away the hardmask layer and a portion of the flash memory gate stack in the flash region to form a partial flash memory gate; and
subsequently etching the logic gate stack and the remainder of the flash memory gate stack using the remaining hardmask as a mask to form logic gates and flash memory gates.

25. The method of claim 24, wherein the logic region and the flash region are located on a single die.

26. The method of claim 24, wherein the hardmask layer comprises an anti-reflective coating (ARC) hardmask layer.

27. The method of claim 24, wherein the ARC hardmask layer is comprised of one or more materials selected from the group consisting of oxide, oxynitride, nitride, and carbon.

28. The method of claim 24, wherein the flash memory gates have a length of less than 150 nm and a pitch of less than 400, and the logic gates have a length of less than 150 nm.

* * * * *